US005151696A

United States Patent [19]

Kasahara et al.

[11] Patent Number: 5,151,696

[45] Date of Patent: Sep. 29, 1992

[54] MULTI-FUNCTION KEYBOARD FOR REMOTE CONTROL APPARATUS

[75] Inventors: Yasuhiro Kasahara; Hiroshi Suzuki; Yasuhiro Yakushiji, all of Yokohama; Shoichi Ito, Hamamatsu; Takashi Suzuka, Osaka, all of Japan

[73] Assignees: Hitachi, Ltd., Tokyo; Sanwa Electronics Instrument Co., Ltd., Higashiosaka, both of Japan

[21] Appl. No.: 500,504

[22] Filed: Mar. 28, 1990

[30] Foreign Application Priority Data

Mar. 29, 1989 [JP] Japan .................................. 1-075154

[51] Int. Cl.[5] ..................... H03M 11/04; H04B 1/034

[52] U.S. Cl. ...................................... 341/22; 200/309; 340/825.72

[58] Field of Search ..................... 341/22, 23, 176, 31; 340/711, 825.72, 825.69, 762, 716; 200/309, 314

[56] References Cited

U.S. PATENT DOCUMENTS

| | | | |
|---|---|---|---|
| 4,078,257 | 3/1978 | Bagley | 340/762 |
| 4,336,530 | 6/1982 | Koike et al. | 341/23 |
| 4,348,660 | 9/1982 | Robertsen et al. | 341/23 |
| 4,441,001 | 4/1984 | Miyano et al. | 200/309 |
| 4,551,717 | 11/1985 | Dreher | 341/31 |
| 4,567,481 | 1/1986 | Meier et al. | 340/716 |
| 4,633,227 | 12/1986 | Menn | 340/711 |
| 4,745,397 | 5/1988 | Lagerbauer et al. | 341/23 |
| 4,768,230 | 8/1988 | Viebrantz et al. | 341/22 |
| 4,855,746 | 8/1989 | Stacy | 341/23 |
| 4,874,913 | 11/1989 | Aoki et al. | 200/314 |
| 4,879,557 | 11/1989 | Roche | 341/22 |

FOREIGN PATENT DOCUMENTS 61-23742 2/1988 Japan .

OTHER PUBLICATIONS

IBM Technical Disclosure Bulletin, Langdon Jr. et al. vol. 24, No. 10, Mar. 1982, pp. 4905–4906.

Johnson, Jr., "Keyboard with Changeable Encoding and Key Designation," IBM Technical Disclosure Bulletin, vol. 13, No. 7, Dec. 1970.

*Primary Examiner*—Donald J. Yusko
*Assistant Examiner*—John Giust
*Attorney, Agent, or Firm*—Antonelli, Terry, Stout & Kraus

[57] ABSTRACT

A remote control apparatus has a plurality of manipulating buttons fitted in a plurality of windows, respectively, formed in a casing member, each of the manipulating buttons being formed of a transparent material and having a lower portion provided with a switch actuating projection and an upper portion disposed within each of the windows for allowing user to operate the button with his or her finger. A switch array includes a plurality of switches corresponding to the plural manipulating buttons and is mounted within the casing member such that each of the switches can be changed over between ON and OFF states by contact with a switch actuating projection in the operation of the corresponding manipulating button. A mode change-over switch is selectively movable to a plurality of positions for setting one of a plurality of predetermined modes in which the switch array is to be operated, and a display plate for displaying marks indicating functions of the individual manipulating buttons in the mode set by the mode change-over switch is movable with the mode change-over switch and is located between the button array and the switch array so that the marks can be visually recognized through the individual manipulating buttons, and so that the marks displayed correspond to the mode set by the mode change-over switch. The display plate includes slots through which the switch actuating projections extend.

6 Claims, 5 Drawing Sheets

FIG. 4A
FIG. 4B
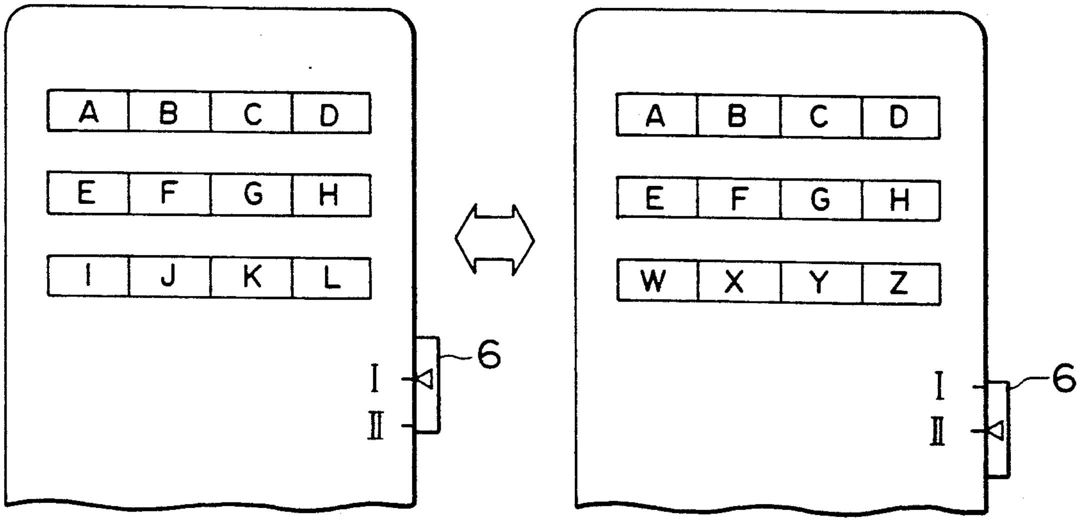
FIG. 4C
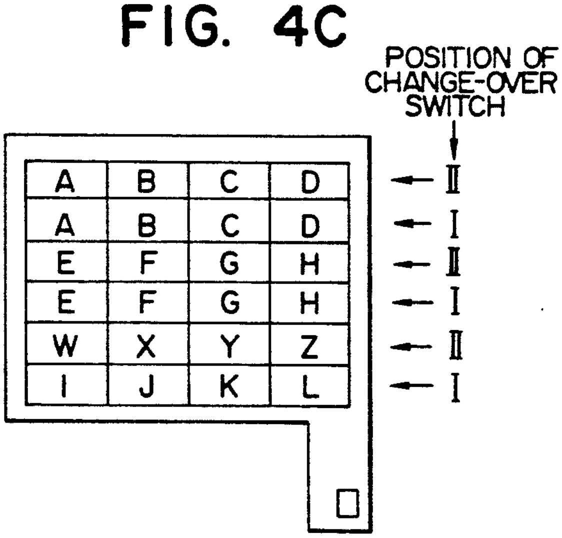

MULTI-FUNCTION KEYBOARD FOR REMOTE CONTROL APPARATUS

BACKGROUND OF THE INVENTION

The present invention relates generally to a multi-function control apparatus, and more particularly to a multi-function control apparatus for controlling or manipulating a variety of electric/electronic devices for home use, such as, for example, television receivers, video tape recorders, air conditioners, audio systems, and the like.

In keeping with highly enhanced or sophisticated performance and functions of various electric/electronic apparatuses or machines for home use, the functions required for the control apparatus designed for control or manipulation are significantly increased in both the number and the type of functions. Further, there exists a consistent demand for miniaturization in the remote control apparatus among others. For coping with the increase in the number of functions as well as the demand for miniaturization, there are proposed a method of increasing the number of manipulating buttons provided in the control apparatus in accordance with the number of the functions as required and a method according to which the manipulating buttons are adapted to be used in common to a variety of the electric/electronic apparatuses for home use by changing over control signal codes by means of a change-over switch in accordance with the types of the home-use apparatus to be controlled. However, in the case of the first mentioned method, a problem is encountered in that the size of the remote control apparatus is necessarily increased in correspondence with the increase in the number of the manipulating buttons or manipulatability of the remote control apparatus is degraded when the size of the individual manipulating buttons is reduced in an attempt to increase the number of the buttons provided for a given space. On the other hand, the second mentioned method suffers from a problem that because of multiplex functions imparted to each of the manipulating buttons, the single manipulating button is required to have a plurality of display information, involving complication in the display of the function identifiers or names. As a prior art technique for solving the above problems, there may be mentioned the use of a liquid crystal touch panel device, which is however accompanied with intolerably high expenditure. Parenthetically, as typical examples of the prior art techniques mentioned above, remote control transmitters manufactured by Sharp Corporation of Japan are disclosed in JP-A-61-224020 or in the Japanese magazine "Television Gijutsu (Technology)", December 1988, p. 40 (published by Electronic Technology Publication Company of Japan).

In the case of the hitherto known techniques mentioned above, no consideration is paid to the degradation in the manipulatability of the remote control apparatus which is brought about by increasing the number of the manipulating buttons in an effort to comply with sophistication of the functions of the remote control apparatus. This problem will become more serious since it is expected that the number of the manipulating buttons will further be increased as the functions are more and more enhanced in the future.

SUMMARY OF THE INVENTION

Accordingly, it is an object of the present invention to provide an inexpensive multi-function control apparatus which is capable of controlling or manipulating a multiplicity of functions of an apparatus to be controlled and is highly sophisticated in respect to the functions without increasing the size or configuration of the control apparatus as compared with the hitherto known ones and which is enhanced in respect to the making it possible to identify in one-to-one correspondence a variety of function indications and the corresponding buttons for manipulation.

Another object of the present invention is to provide a multi-function control apparatus of the type mentioned above which is capable of performing a remote control for controlling a variety of functions.

In view of the above objects, there is provided according to an aspect of the present invention a multi-function control apparatus or a remote control apparatus which comprises a casing having an array of plural windows formed therein, a manipulating button array mounted within the casing and including a plurality of manipulating buttons fitted in the plural windows, respectively, each of the manipulating buttons being formed of a flexible transparent material and having a lower portion provided with a projection and an upper portion so disposed within the associated one of the windows as to be exposed therethrough for allowing a user to operate the button with a finger, the button being able to be resiliency displaced to an operative position when depressed by a finger of the user and restored to an inoperative position upon release, a switch array including a plurality of switches corresponding to the plural manipulating buttons and mounted within the casing such that each of the switches can be changed over between ON and OFF states by means of the projection upon displacement of the associated one of the manipulating buttons to the operative position, the switch array having first terminal means connected to the plural switches for providing information concerning which of the switches is in the actuated position, a mode change-over switch selectively movable to one of a plurality of positions for setting one of a plurality of predetermined modes in which the switch array is to be operated, the mode change-over switch array having second terminal means for providing information about the mode in which the switch array has been set, a name plate interposed between the manipulating button array and the switch array and coupled operatively to the mode change-over switch so as to be selectively movable to a plurality of positions corresponding to the preset modes, respectively, with the movement of the mode change-over switch for setting the mode, the name plate having one surface imprinted with marks indicating the functions of associated manipulating buttons in each of the modes at a plurality of positions located in opposition to the plural manipulating buttons, respectively, the name plate being further provided with at least one elongated slot in which the projection of the manipulating button is inserted when the manipulating button is in the actuated position so that the projection imposes no load on the name plate even when the manipulating button is at the actuated position, and output means connected to the first and second terminal means for selecting and outputting one of predetermined different control signals or remote control code signals on the basis of the information concerning the mode set by the mode change-over switch and provided by the second terminal means and information concerning the ON and OFF states of the plural switches and provided by the first terminal means.

With the structure of the multi-function control apparatus or remote control apparatus according to the present invention, wherein the manipulating buttons are made transparent with a predetermined transmissivity and wherein the name plate which may be imprinted with characters, numerals, signs, colors and/or the like representing or indicating corresponding functions is disposed below the transparent button array so that these displays or marks indicating the manipulating functions can be visually recognized straightforwardly through the manipulating buttons, and wherein the name plate is made movable with the displacement of the mode change-over switch for changing over the various remote control codes, it is possible to transmit selectively a plurality of control codes with a single one of the manipulating buttons. Assuming, by way of example, that each of N manipulating buttons can be selectively changed over among n positions, the number of the remote control codes capable of being transmitted amounts to N×m, which means that the control apparatus according to the invention is functionally equivalent to such a multi-function control apparatus in which (N×m) manipulating buttons were really provided.

Further, in addition to making the manipulating buttons transparent for enhancing the manipulatability, each of the manipulating buttons is provided with a projection for closing and opening the associated switch for validating the remote control code in the mode determined by the change-over switch and an elongated hole or slot is formed in the name plate for preventing the abovementioned projection from contacting the name plate upon movement thereof so that the name plate can be moved without being subjected to any load even when the manipulating button is maintained in the depressed state, whereby the marks indicating the functions as required are constantly displayed beneath the transparent manipulating buttons, respectively. Thus, the functions can discriminatively be identified by the function marks in one-to-one correspondence with the manipulating buttons at any time.

The remote control codes corresponding to the functions as required can be selected by the mode change-over switch and the corresponding indications or marks on the name plate can be visually recognized by the user through the transparent manipulating buttons. At that time, the user can identify without fail the manipulating button corresponding to the function which is intended by the user by virtue of the one-to-one correspondence between the manipulating buttons and the indications on the name plate.

When the remote control code signal corresponding to the requisite function is to be transmitted, this can be accomplished simply by depressing or actuating the corresponding transparent manipulating button. In that case, the projection formed integrally with the actuated manipulating button actuates the associated switch, whereby the corresponding remote control code signal is identified by a discriminating circuit to be subsequently transmitted to the transmission control circuit. At that time, the projection of the manipulating button is inserted through the elongated slot formed in the name plate. Thus, the abovementioned switch can be directly operated without application of a load to the name plate through the projection of the transparent button. In other words, the name plate can be moved even in the state in which the manipulating button is being depressed, whereby the name plate is satisfactorily protected against injury and abrasion thereof, erasure of the function indicating marks and others.

BRIEF DESCRIPTION OF THE DRAWINGS

FIGS. 3A to 3D and FIGS. 4A to 4C are views for illustrating various marks imprinted on a name plate and change-over of the marks displayed through manipulating buttons in accordance with the positions of the name plate;

DESCRIPTION OF THE PREFERRED EMBODIMENTS

Figure 1:
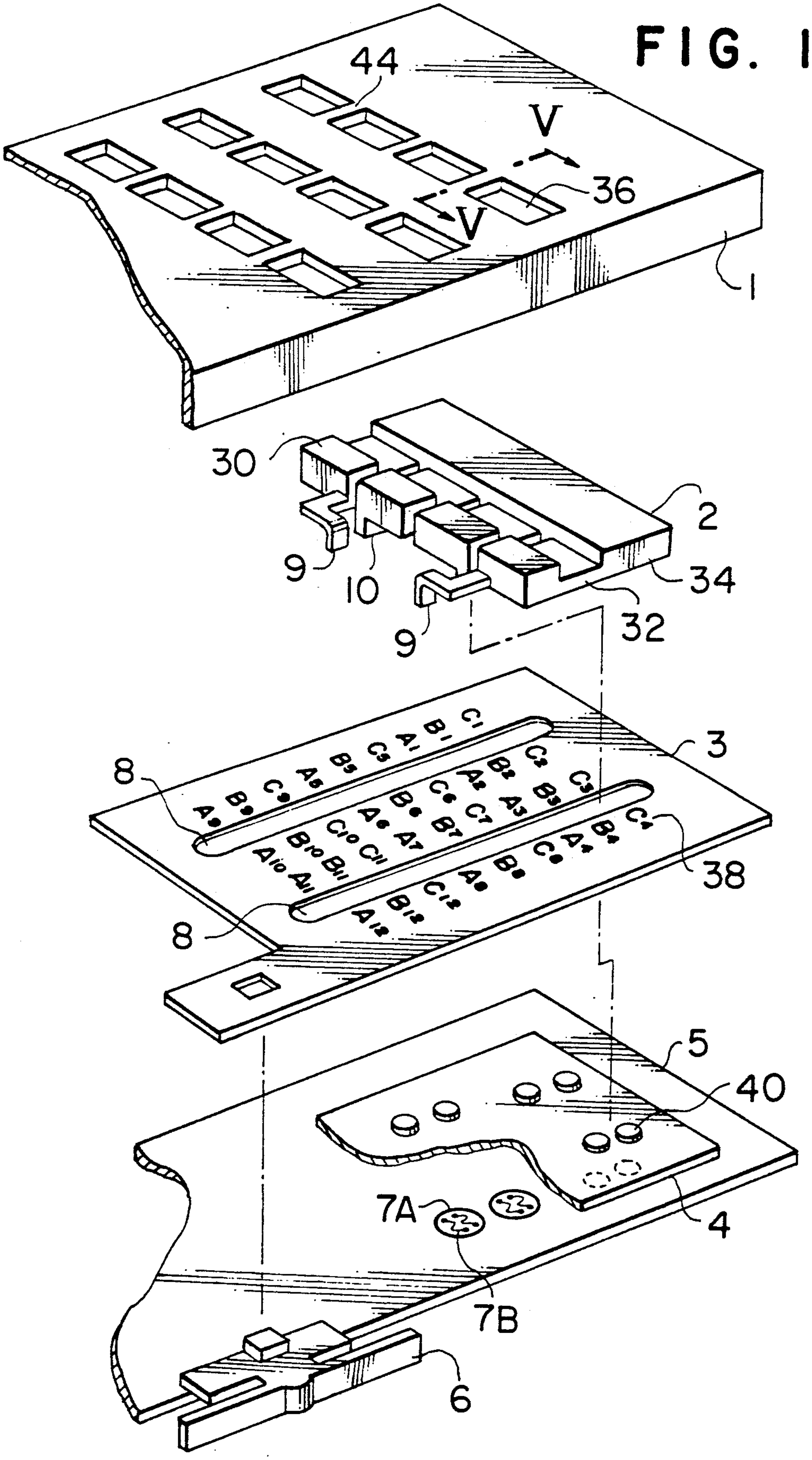
FIG. 1 is an exploded perspective view showing constituent parts of the multi-function control apparatus according to an exemplary embodiment of the present invention.

FIG. 1 is an exploded perspective view showing major constituent parts of a multi-function remote control apparatus according to an exemplary embodiment of the present invention. In the figure, reference numeral 1 denotes an upper casing half which is combined with a lower casing half (not shown) to constitute a casing within which there are accommodated a manipulating button array 2, a name plate 3, a switch key array rubber plate 4, a switch array 5 and a mode change-over switch 6. Formed in the upper casing half 1 are a plurality of windows 36 which are partitioned from one another by bridge portions 44. In the case of the illustrated embodiment, the manipulating button array 2 is composed of three button groups or sets each including four manipulating buttons 30, wherein only one of the three sets is shown.

Figure 5:
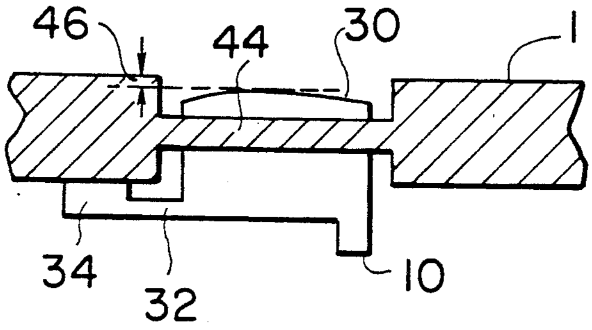
FIG. 5 is a sectional view taken along the line V—V in FIG. 1.

More specifically, the manipulating button array 2 includes the manipulating buttons 30, mount portions 34 and hinge portions 32 which are formed in an integral structure of a transparent flexible material. The total number of the manipulating buttons corresponds to that of the windows. In the assembled state, each of the manipulating buttons 30 is exposed through the associated one of the abovementioned windows 36 formed in the upper casing half 1 so that the user can manipulate the buttons 30 through the windows 36. As can be seen in FIG. 5, the mount portions 34 of the manipulating button array are secured to the lower surface of the upper casing half 1 at such position that the manipulating buttons 30 are in alignment with and extend through the associated windows 36, respectively. Thus, when the user depresses the manipulating button 30 with his or her finger, the button is displaced downwardly about the hinge portion 32 serving as a fulcrum, whereby an associated projection 9 or 10 formed integrally with the respective manipulating button and projecting downwardly is caused to act on an associated switch 7 of the switch array 5 for thereby changing over the switch 7 between ON and OFF states in a manner described hereinafter. When the finger is removed, the manipulating button is restored to the original state under resiliency of the hinge portion 32. The transparent manipulating buttons should preferably be realized in the form of a convex lens so that marks imprinted on the name plate 3 can be seen as enlarged through the respective windows, as will hereinafter be described. By virtue of this feature, the size of the individual various marks imprinted on the name plate can be reduced to thereby allow the number of the marks accommodated within a small space to be correspondingly increased, whereby the distance between the adjacent windows formed in the upper casing half can also be reduced. Further, the top of the manipulating button should preferably be positioned slightly lower than the upper surface of the upper casing half so that a small margin 40 is available. In that case, even when the remote control apparatus should inadvertently be laid upside-down on a floor, for example, the switches can be protected against unintended actuation which would otherwise occur under its own weight.

Figure 6:
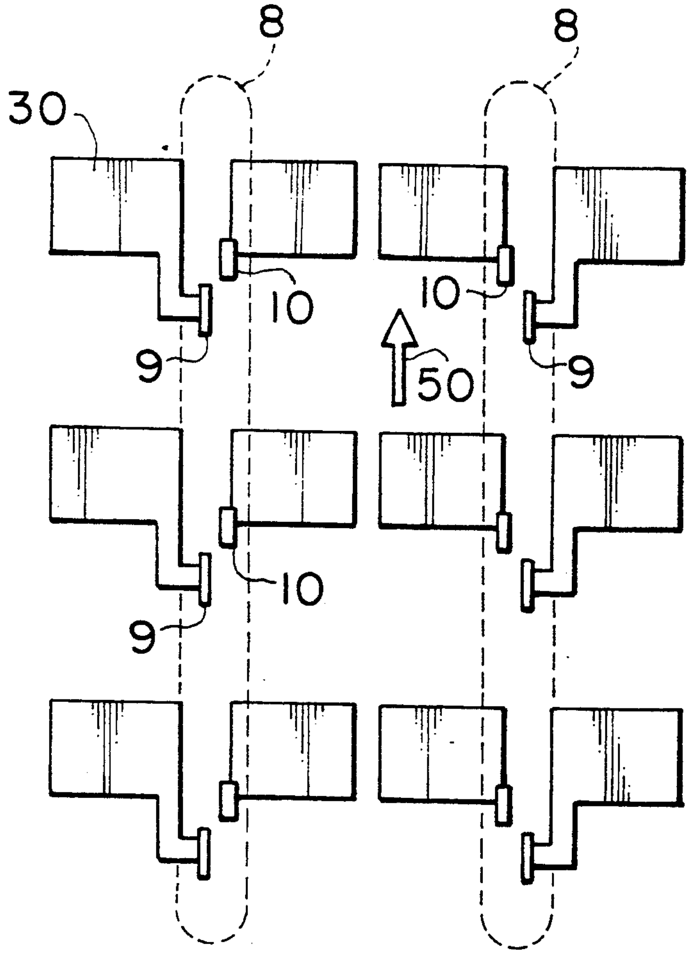
FIG. 6 is a view for illustrating positional relationships between projections of the individual manipulating buttons and elongated slots formed in the name plate in the multi-function control apparatus according to an embodiment of the invention.

Turning back to FIG. 1, a reference numeral 3 denotes the name plate on which there are imprinted marks such as characters, signs, numerals, colors or the like which indicate, respectively, various functions of the individual manipulating buttons in a plurality of predetermined operation modes. This name plate 3 is so mounted as to be selectively movable to a plurality of positions corresponding to the various operation modes, respectively, accompanying the movement of the mode change-over switch 6 upon mode setting. The marks indicating the functions in the mode set in accordance with the position of the name plate are adapted to be positioned beneath the transparent manipulating buttons, respectively, so that the marks can be visually recognized within the windows through the transparent manipulating buttons, as will be described in more detail later on. The name plate 3 is provided with elongated holes or slots 8 at such positions that when the manipulating button is depressed to cause the associated projection to be displaced downwardly, the latter can engage with an associated one of key switches 40 formed in the rubber plate 4 without being interfered with by the name plate 3 to thereby change over the corresponding switch 7 between ON and OFF states. In this conjunction, it should be noted that the projections 9 and 10 of the manipulating buttons 30 are arranged in such a positional relation to the elongated slots 8 as illustrated in FIG. 6. More specifically, the projections 9 and 10 of two adjacent manipulating buttons, respectively, are so formed as to substantially align with each other in the direction in which the name plate 3 is moved as indicated by an arrow 50 in FIG. 6, while the elongated slots 8 extend in the moving direction 50 of the name plate 3 with a sufficient margin to receive therein the projections 9 and 10 even when the name plate 3 is moved. In the case of the illustrated embodiment, the projections 9 and 10 of the manipulating buttons can all be placed within only two elongated slots 8. Thus, the number of elongated slots to be provided in the name plate can be decreased, whereby not only the name plate 3 is protected against degradation in mechanical strength but also sufficient space for imprinting the marks mentioned previously on the name plate 3 can be assured.

The key switches 40 of the rubber plate 4 and the switches 7 of the switch array 5 are provided in correspondence to the manipulating buttons 30. respectively. As can be seen in FIG. 1 each of the switches 7 includes a pair of electrical conductors 7A and 7B provided with a distance therebetween in such disposition that when the key switch 40 is depressed by the projection (9 or 10) of the corresponding manipulating button 30, a short-circuit is formed between the paired conductors 7A and 7B by an electrically conductive element provided on the rear or bottom surface of the key switch 40, whereby the switch 7 is changed over to the "ON" state. The mode change-over switch 6 and the individual switches constituting the switch array 5 are connected in a circuit configuration such as shown in FIG. 2.

Figure 2:
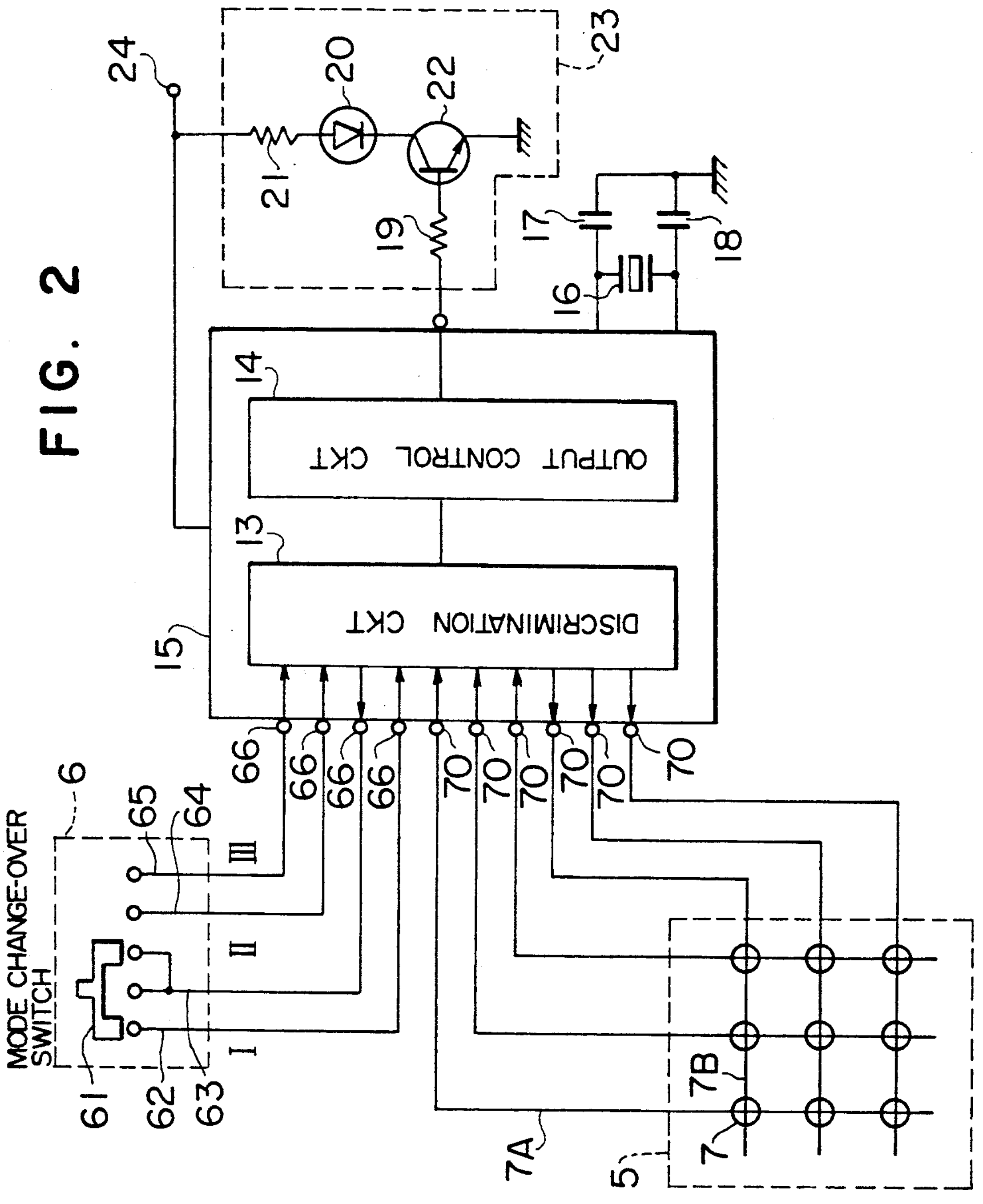
FIG. 2 is a diagram showing a circuit arrangement of the same.

Referring to FIG. 2, the mode change-over switch 6 includes a movable contact 61 and stationary contacts 62, 63, 64 and 65, wherein the movable contact 61 is movable to any one of three predetermined positions corresponding to the modes I, II and III, respectively. At the position of the switch 6 corresponding to the mode I, a short-circuit is formed between the contacts 62 and 63. At the position corresponding to the mode II, the contacts 63 and 64 are short-circuited to each other. In the mode III, a short-circuit is formed between the contacts 63 and 65. Accordingly, a group of terminals 66 provide information for the mode set by the mode change-over switch 6. On the other hand, the electric conductors 7A and 7B constituting each of the switches 7 of the switch array 5 are connected to terminals 70 in such a manner as shown in FIG. 2. When one of the switches 7 is short-circuited by the electrically conducting element of the key switch 40, a corresponding pair of the terminals 70 is brought to the short-circuited state. Since the combination of the paired terminals brought to the short-circuited state varies in dependence on the switch whose electrical conductors are short-circuited, the group of the terminals 70 provides the information about which of the switches 7 is in the short-circuited state.

The terminal groups 66 and 70 are connected to a microcomputer 15 which includes a discrimination circuit for producing a signal for selecting a remote control code corresponding to the function of the short-circuited switch in the set mode on the basis of the information related to the mode set by the mode change-over switch 6, which information is provided by the terminals 66, and the information concerning which of the switches 7 is in the short-circuited state, this information being provided by the terminals 70. Additionally, the microcomputer 15 includes an output control circuit 14 for generating the remote control code signal selected in accordance with the output signal of the discrimination circuit 3. The remote control code signal is applied to the base of transistor 22 constituting a part of a transmission control circuit 23 through a resistor 19 to thereby turn on the transistor 22, as a result of which an infrared light emission diode 20 is driven to emit an infrared remote control signal modulated with the aforementioned code signal. Incidentally, the microcomputer 15 and the transmission control circuit 23 are connected to a power supply source by way of a terminal 24. A reference clock signal for the microcomputer is supplied from an oscillation circuit composed of a vibrator 16 and oscillating capacitors 17 and 18. Since the microcomputer 15 and the transmission control circuit are of known structures, a detailed description thereof will be unnecessary.

Figure 3A:
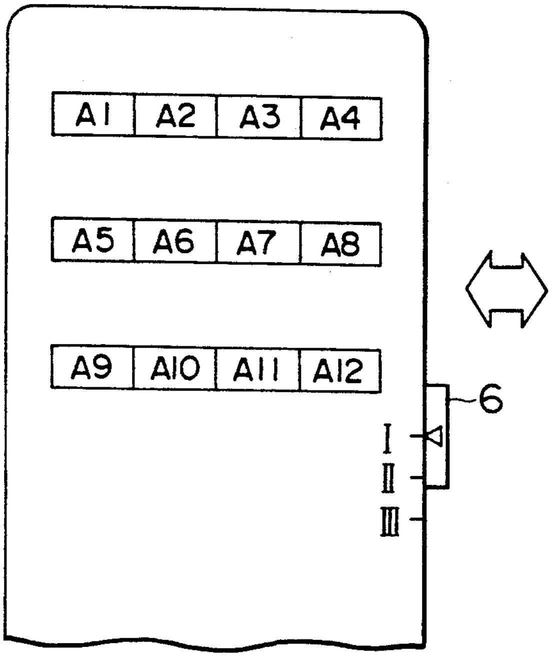
Figure 3B:
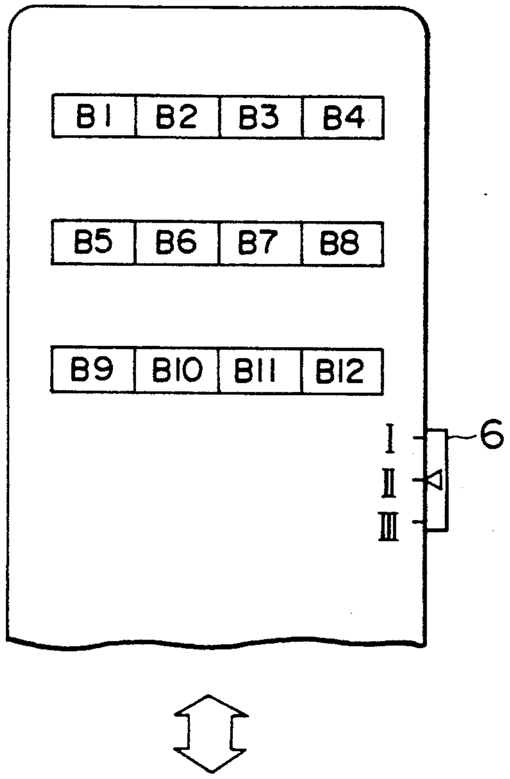
Figure 3D:
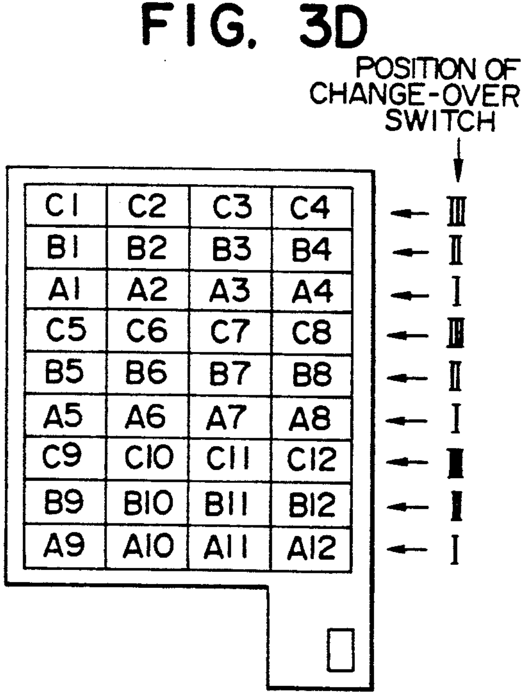
Figure 3C:
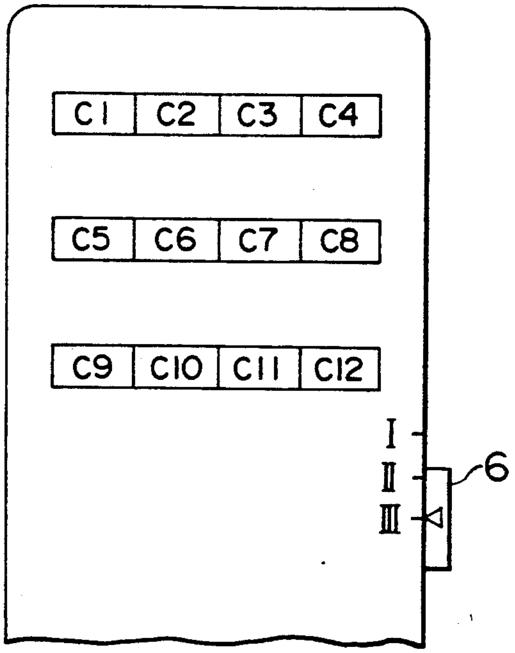

Next, referring to FIGS. 3A to 3D, description will be made of the states of the marks displayed at the various manipulating buttons in the various modes. As can be seen in FIG. 3D, there are imprinted on the name plate 3 the marks $A_1$ to $A_{12}$, $B_1$ to $B_{12}$ and $C_1$ to $C_{12}$ at the illustrated positions which correspond to the modes I, II and III, respectively, and which indicate the functions of the associated buttons in the respective modes. When the mode change-over switch 6 is moved to set the mode I, there are displayed visually recognizable marks $A_1$ to $A_{12}$ through the individual transparent manipulating buttons 30 in the windows 36 formed in the upper casing half in such a manner as shown in FIG. 3A. When the mode change-over switch 6 is moved to the position where the mode II is set, the marks $B_1$ to $B_{12}$ are displayed visually through the individual transparent manipulating buttons in the windows of the upper casing half in such an array as shown in FIG. 3B. When the mode III is set by moving correspondingly the mode change-over switch 6, there are displayed visually the marks $C_1$ to $C_{12}$ through the individual transparent manipulating buttons in the window of the upper casing half in such an array as shown in FIG. 3C.

Thus, when the mode I is set by the mode change-over switch 6, the manipulating button located at the leftmost on the topmost row, as viewed in FIG. 3A, can operate with a function $A_1$. More specifically, when this manipulating button is depressed, a short-circuit is formed in the corresponding switch 7 to cause the microcomputer 15 to output a signal for selecting a remote control code which corresponds to the function $A_1$, whereon the transmission control circuit 23 emits the remote control signal indicating the function $A_1$. On the other hand, in case the mode change-over switch 6 is set to the position for the mode II, depression of the same manipulating button causes the transmission control circuit to emit a remote control signal which corresponds to a function $B_1$. In this way, by actuating the twelve manipulating buttons in the three different modes, there are made available remote control signals indicating different functions in a number of 36 ($=12\times3$) in total, while the functions imparted to the individual manipulating button in the selected mode are displayed straightforwardly through the manipulating buttons themselves. Thus, the user can visually identify or recognize the button having the intended function at first glance.

Referring to FIGS. 4A to 4C, there are shown the marks on the name plate and the displays on the manipulating buttons in the case where either one of the two mode I and II is to be established by the mode change-over switch 6. In this case, the name plate 3 is imprinted with marks indicating the functions of the individual manipulating buttons in the mode I at the positions shown in FIG. 4C. In the case of the instant embodiment, it is assumed that the manipulating buttons arrayed on the top row and the intermediate row operate with the same functions A to H, respectively, in both the modes I and II, and only the manipulating buttons arrayed on the bottom row operate with functions I to L in the mode I while operating with functions W to Z in the mode II. In this connection, the functions A to H may be those functions which are utilized with a relatively high frequency in the ordinary use of the remote control apparatus such as, for example, the functions of program selection, volume adjustment and the like in a television receiver, while the functions I to L may be those functions which are utilized with a relatively low frequency. Finally, the functions W to Z may be those functions which are utilized only rarely and for which although the remote control can provide convenience but erroneous manipulation may be accompanied with undesirable results such as adjustment of the picture quality, sound quality, time adjustment of the clock or the like. By establishing the relations between the operation modes and the functions of the individual buttons in this manner, the remote control apparatus can be used ordinarily in the mode I while the mode II is selected only by the user who desires to make use of the functions W to Z. In this conjunction, it is noted that in the case of the remote control apparatus known heretofore, a detouchable or slidable door (closing member) is provided for the manipulating buttons imparted with the functions equivalent to those W to Z to thereby make it troublesome or difficult to access these manipulating buttons in the ordinary state. In contrast, according to the teaching of the invention as provided in the illustrated embodiment, rearrangement of the available functions can be easily realized in accordance with the frequencies of the use of the manipulating buttons without resorting to the door mechanism mentioned above.

In the foregoing, the present invention has been described in conjunction with exemplary embodiments which are applied to a remote control apparatus. However, it will readily be appreciated that the present invention is not limited to such remote control apparatus but can equally be applied to multi-function control apparatus for machinery or apparatuses such as facsimiles, word processors and the like where the changing-over of the functions is desirable or required.

The present invention which can be implemented in the manners described above brings about advantageous actions and effects mentioned below.

When the transparent manipulating buttons are provided in a number of N with the functions assigned to the individual manipulating buttons being exchangeable among m operation modes, there can be realized ($N\times m$) functions with the manipulating buttons in a number of N, whereby the multi-function remote control apparatus can be implemented in a miniaturized structure.

By imprinting the name plate with the marks indicating the operational functions and interlocking the name plate with the mode change-over switch so as to allow the functions to be visually recognized through the transparent manipulating buttons, it is possible to carry out the remote control while constantly confirming the relevant manipulating button in one-to-one correspondence with the desired function, whereby the manipulatability of the remote control apparatus can be enhanced significantly.

We claim:

1. A button switch apparatus, comprising:

a case formed with a plurality of windows;

a button array including a plurality of operating buttons adapted to said windows, respectively, each of said operating buttons having a transparent part;

a switch array including a plurality of switches associated with said buttons, respectively;

a mark sheet disposed between said button array and said switch array and having sets of marks recorded thereon, respective sets indicating respective sets of operating functions of said operating buttons such that at least two marks are recorded for each of said operating buttons, said marks being selectively viewable through the transparent parts of said operating buttons by movement of said mark sheet;

mode selecting means for selecting one of a plurality of predetermined modes, each mode determining a specific set of operating functions of said operating buttons, by moving said mark sheet so that the marks indicating the respective set of operating functions of said operating buttons in a selected mode are viewed through the transparent parts of said operating buttons; and means for allowing each of said operating buttons to be operated with no contact with said mark sheet, including at least one elongated slit formed in a offset manner in said mark sheet so as not to overlap with the transparent parts of said operating buttons and through which slit, a plurality of said operating buttons are capable of actuating the associated switch with no contact with the mark sheet when the operating button is operated as said mark sheet is moved.

2. A button switch apparatus according to claim 1, wherein said switches are positioned beneath the slit.

3. A button switch apparatus according to claim 2, wherein each of said operating buttons has a projection which extends through said slit with no contact with the mark sheet to actuate the associated switch when the operating button is operated.

4. A button switch apparatus according to claim 1, wherein the transparent part of each of said operating buttons provides a convex lens function.

5. A switch controller, comprising:

plural switches;

operating means including respective operating buttons for actuating each of the switches, a part of each operating button being transparent;

indicating means located between said switches and said operating means for indicating plural functions for each switch;

selecting means for moving said indicating means between said switches and said operating means so that one of the plural functions is displayed for each of the switches through the transparent part of the associated operating button and for causing each of said switches to be actuated so as to perform the function as displayed; and wherein said indicating means has at least one elongated slit formed in an offset manner therein so as to not overlap with the transparent parts of the operating buttons and through which slit a plurality of said operating buttons are capable of actuating the associated switch with no contact with the indicating means when an operating button is operated as said indicating means is moved.

6. A switch controller, comprising:

plural switches;

operating means for actuating each of the switches and having a transparent part;

indicating means disposed between said plural switches and said operating means for indicating plural functions for each of the switches;

signal generating means for generating a control signal when each of said plural switches is actuated;

selecting means for moving said indicating means between said switches and said operating means so that an indication indicating one of the functions for each of said switches is located in registration with the transparent part of the operating means for actuating said switch and for causing said signal generating means to generate the control signal according to said one function when said switch is actuated; and wherein said indicating means has at least one elongated slit formed in an offset manner therein so as to not overlap with the transparent parts of the operating buttons and through which slit a plurality of said operating buttons are capable of actuating the associated switch with no contact with the indicating means when an operating button is operated as said indicating means is moved.

* * * * *